United States Patent [19]
Meiri et al.

[11] Patent Number: 5,313,068
[45] Date of Patent: May 17, 1994

[54] PARTITIONING METHOD FOR E-BEAM LITHOGRAPHY

[75] Inventors: Abraham Z. Meiri, Haifa; Dov Ramm, Menashe; Uzi Shvadron, House, all of Israel

[73] Assignee: International Business Machines Corporation, Armonk, N.Y.

[21] Appl. No.: 818,010

[22] Filed: Jan. 8, 1992

[30] Foreign Application Priority Data

Jan. 24, 1991 [IL] Israel ................................. 097021

[51] Int. Cl.⁵ ............................................. H01J 37/302
[52] U.S. Cl. ................................. 250/492.22; 250/398
[58] Field of Search ............. 250/492.2, 492.22, 398; 430/296; 364/490

[56] References Cited

U.S. PATENT DOCUMENTS

| | | | |
|---|---|---|---|
| 4,291,231 | 9/1981 | Kawashima et al. | 250/492.22 |
| 4,477,729 | 10/1984 | Chang et al. | 250/492.22 |
| 4,494,004 | 1/1985 | Mauer, IV et al. | 250/398 |
| 4,520,269 | 5/1985 | Jones | 250/492.22 |
| 4,812,962 | 3/1989 | Witt | 250/492.22 |
| 4,943,729 | 7/1990 | Ando et al. | 250/398 |
| 5,086,398 | 2/1992 | Morizuini | 250/398 |

*Primary Examiner*—Paul M. Dzierzynski
*Assistant Examiner*—Kiet T. Nguyen
*Attorney, Agent, or Firm*—John J. Goodwin; Robert M. Trepp

[57] ABSTRACT

A method of partitioning design shapes, in an E-beam lithography system, into subshapes such that a constant dose may be applied to an E-beam sensitive resist within each subshape. Within each subshape the constant dose corresponds to an approximation to an indicator function, indicative of the degree of the proximity effect, such as the effective exposure of the resist from backscattered electrons or the required dose. The error of the approximation is equal to a predetermined value for each subshape, and can depend upon the position of the subshape within the shape and the influence of errors in the applied dose at that position on the position, on development, of the edge of the shape.

8 Claims, 3 Drawing Sheets

PARTITIONING METHOD FOR E-BEAM LITHOGRAPHY

BACKGROUND OF THE INVENTION

1. Field of the Invention

The invention relates to a partitioning method for use in proximity effect correction in electron-beam lithography.

2. Description of the Prior Art

In the technique of electron beam lithography an electron beam is used to delineate the features of a semiconductor device by selectively irradiating a substrate coated with an electron-beam sensitive resist. The electron beam is deflected and shaped in a precise manner to define the required shape in the resist. The pattern is then developed in the resist. The substrate can be either a semiconductor wafer, as in the case of direct-write lithography, or glass, metal or other material as in the case of a high resolution mask for subsequent use in fabricating the semiconductor device.

Scattering of the electron beam from the resist and the substrate gives rise to non-uniform exposure of the resist and thus to distortions in the developed shapes. This is termed the proximity effect and must be corrected for in an e-beam lithography process either by changing the shapes to be developed or by varying the dose over the design to take the scattering into account.

Since the dose applied to resist may vary over the design, the design pattern must, during the process of determining and producing control signals for the E-beam writing tool, be divided into a number of shapes over which the dose applied by the writing tool is constant. This process is referred to as shape partitioning.

The prior art approaches to shape partitioning for E-beam lithography involve prepartitioning the design shapes prior to correction for the proximity effect. They employ a set of rules-of-thumb, based on the layout of the design, in order to provide finer partitioning in places where layout of the design indicates that the magnitude of the proximity effect is likely to be large. For example, fine partitioning is used where there is an influence of surrounding shapes on a given shape, and a coarser partitioning is used where there are no surrounding shapes in a vicinity of the given shape.

The simplest such method is described in Grobman, Speth and Chang, "Proximity Correction Enhancements for 1 $\mu$m Dense Circuits Magnitude and Correction Techniques" which appeared in IBM J. Res. Dev., Vol. 24, pp. 537-544, (1980), where each sufficiently large rectangle is partitioned into an internal area and four "sleeves" (narrow perimetral rectangular strips). No further partitioning of sleeves is made. This method works well where the size of the smallest design shapes is around 1 $\mu$m.

Another method of shape partitioning is described in Parikh, "Technique for Automatic Subdivision of Pattern Data for Enhanced Proximity Effect Correction" which appeared in the IBM Technical Disclosure Bulletin Vol. 24, pp. 438-451, (1980). This method employs the self-consistent technique of proximity correction where the doses, which have to be assigned to prepartitioned shapes, are defined as a solution of a set of linear equations. In this method the partitioning is refined, if needed, on each iteration and then the proximity correction is made once more, until some criteria on the proximity effect variations across each subshape are fulfilled. The method has disadvantages of low computational efficiency and of a need to define the basic prepartitioning with a dense set of predefined sample check points.

The prior art method known as "intelligent partitioning" is described in Kratschmer, "Verification of a proximity effect correction program in Electron beam Lithography", J. Vac. Sci. Tech B, Vol. 19, pp. 1264-1268, (1981). In order to correct for intra-shape proximity effect each sufficiently large rectangle is partitioned into an internal area, four narrow sleeves on the four sides of the rectangle and four small corner squares. Each sleeve is further partitioned by a projection of neighboring shapes onto the current subshape. The design is usually partitioned too fine, so that in the data compaction stage some adjacent rectangles with almost the same dose could merge together. A similar approach is also described in Otto and Griffith "Proximity correction on the AEBLE-150", J. Vac. Sci. Tech. B, Vol. 6, pp. 443-447, (1988).

The disadvantages of intelligent partitioning type methods are firstly high computational load and secondly they produce a greater number of subshapes than are necessary for optimal partitioning. These disadvantages reduce the E-beam lithography throughput.

All the prior art shape partitioning methods partition the design on the basis of the layout of the design shapes. However, there exist methods of proximity correction, such as the method described in Pavkovich "Proximity Effect Correction Calculations by the Integral Equation Approximate Solution Method", J. Vac. Sci. Tech. b, Vol. 4, pp. 159-163, (1986), which use what could be labelled a ""field" approach. In this approach either the backscatter or the dose boost is described by a slowly changing continuous function over the design. This function is obtained, at points on a grid, as a solution of an integral equation. The continuous function given by interpolation of the grid values in these methods acts as an indicator field which contains all the information on the degree or magnitude of the proximity effect. The required dose at any point on the design is found through a predetermined relationship with the indicator field.

SUMMARY OF THE INVENTION

In accordance with the present invention there is provided a method of partitioning, in an E-beam lithography system, a design pattern, comprising at least one design shape, into a plurality of subshapes to each of which a respective constant E-beam dose is applied, the method comprising the steps of:

(a) determining, at a plurality of points on the design, an indicator field indicative of the magnitude of the proximity effect;

(b) determining the boundaries of the subshapes;

(c) assigning a constant indicator value to each subshape; and (d) assigning the respective constant E-beam dose to each subshape based on the value of the constant indicator value, the boundary determination and the constant indicator value assignment being such that, within each subshape, the constant indicator value represents an approximation to the indicator field, the error of the approximation being substantially equal to a predetermined value.

In a preferred form of the invention the predetermined value for the approximation error is chosen for each subshape in dependence on the indicator field so as to provide, on development, a substantially constant error in the location of the edge of each design shape.

The indicator function can be the electron backscatter or any function related to the backscatter such as the E-beam dose required to produce, on development, the required design pattern.

The invention enables a method of adaptive partitioning for E-beam lithography to be provided, comprising subdividing the design shapes into subshapes to each of which a constant dose is assigned, the subdivision being performed after computation of the dose field which corrects for the proximity effect. The subdivision represents a piece-wise constant approximation of the dose field. The variability of the dose field inside each subshape, defines the error of the piece-wise constant approximation.

This method provides design partitioning which is very close to the optimum in the sense that partitioning the design into any smaller number of rectangles would result in the error of the approximation being greater than the predetermined error value, i.e. the accuracy criterion would be violated.

The method of the present invention enables E-beam machine throughput to be increased, since using a smaller number of rectangles decreases the writing time. Experimentation has shown that the method saves about 30% of the rectangles, while maintaining greater accuracy than the intelligent partitioning methods. This gives rise to a gain of about 30% in E-beam machine throughput.

In a preferred form of the invention the determination of the boundaries of the subshapes comprises the steps of:

(b1) dividing the design shapes into rectangular sleeves and inner rectangular areas, each inner rectangular area being surrounded by rectangular sleeves;

(b2) determining a one-dimensional representative indicator function along the length of each of the sleeves, the one-dimensional indicator function being an approximation to the indicator field within the sleeve;

(b3) dividing the sleeves into subshapes, along their length, so that the maximum deviation of the one-dimensional representative indicator function, within each subshape, is equal to twice the predetermined value, and wherein the constant indicator value for each subshape is assigned to be the mid-point of the range of the one-dimensional representative indicator function within the subshape.

The method can also comprise the step between the steps (b2) and (b3) of determining the predetermined value from the one-dimensional indicator function so that, on development, the location of the shape edge lies within predetermined limits. This allows the error in the edge locations of the developed shape to be kept substantially constant over the design.

Increased precision can be obtained by the additional step of dividing each internal rectangular area into rectangular intermediate sleeves and an inner rectangular area and repeating steps (b2) and (b3) for the intermediate sleeves.

The one-dimensional representative indicator function can be chosen as a weighted sum of the indicator value at the edge of the sleeve and the average of the indicator function across the sleeve, the weights in the weighted sum being such that, on development, no edge error be introduced by the substitution of the indicator function by the one-dimensional indicator function.

The invention enables a proximity correction method for E-beam lithography to be provided comprising the above described partitioning method.

According to another aspect of the invention there is provided partitioning apparatus for partitioning, in a E-beam lithography system, a design pattern comprising at least one design shape into a plurality of subshapes to each of which a respective constant E-beam dose is applied, the partitioning apparatus comprising:

logic for determining, at a plurality of points on the design, values of an indicator field indicative of the magnitude of the proximity effect;

logic for determining the boundaries of the subshapes;

logic for assigning a constant indicator value to each subshape; and logic for assigning the respective constant E-beam dose to each subshape based on the value of the constant indicator value, wherein, within each subshape, the constant indicator value represents an approximation to the indicator field, the error of the approximation being substantially equal to a predetermined value for the subshape.

BRIEF DESCRIPTION OF THE DRAWINGS

The invention will be further described hereinafter by way of example with reference to an embodiment thereof and the accompanying drawings wherein.

DETAILED DESCRIPTION OF THE INVENTION

Figure 1:
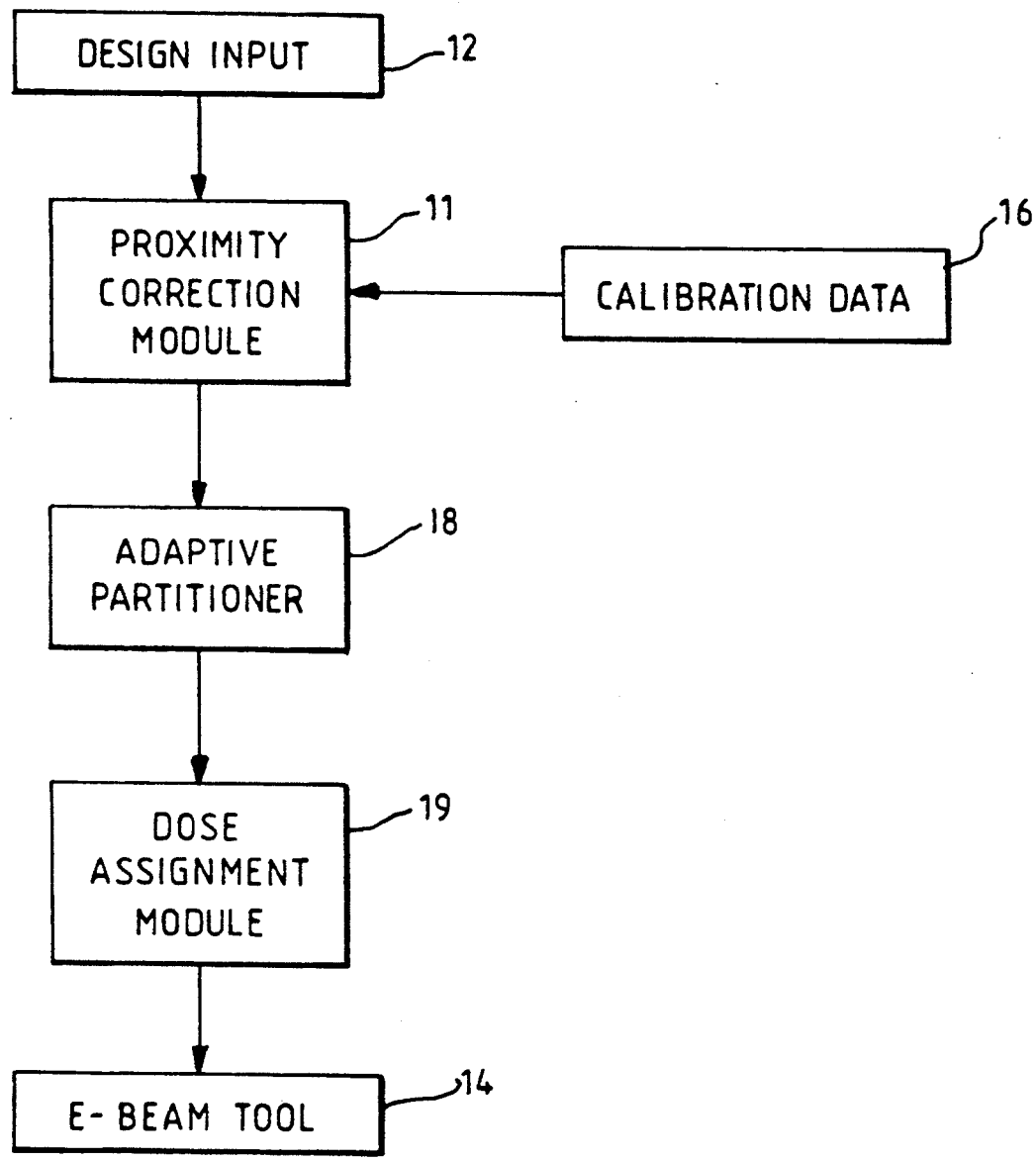
FIG. 1 is a schematic diagram of a post processor in accordance to the present invention.

The embodiment of the invention is a system which consists of several parts and is usually referred to as a Post-processor. The Post-Processor is a combination of hardware and software, which translates the circuit design specifications into numerical control (NC) data for the E-beam tool. FIG. 1 is a schematic diagram of such a Post-processor.

The proximity correction module 11 performs the proximity correction computations i.e. it solves, for the electron backscatter, the integral equation relating the electron backscatter to the applied dose distribution at points on a coarse grid. The electron backscatter is a function which is indicative of the degree of the proximity effect. In this embodiment of the invention the dose required at any given point of the design in order that, on development, the design shapes be undistorted by the proximity effect, apart from a uniform enlargement of the shapes around their edges, is a known function of the backscatter value. The module 11 takes the input design data at input 12. The proximity correction module 11 also uses the calibration data 16 that characterize the particular E-beam lithography system, i.e. the particular combination of E-beam resist, developer, development process and E-beam tool.

The data produced by the proximity correction module are then further processed in the adaptive partitioner 18 in order to partition the shapes of the design into primitive subshapes over which a constant dose is applied to the resist. The dose assignment module 19 uses the data from the proximity correction module 11 together with the adaptively partitioned design data and performs the final computation of the incident dose required to expose each primitive subshape. The partitioned data together with the assigned dose are then used to control the E-beam tool 14.

The partitioning method used in the adaptive partitioner 18 will be described in detail below.

Each sufficiently large shape in the design is first partitioned into rectangular internal areas and narrow perimetral rectangular strips or "sleeves". The width of the edge sleeves is chosen to be in the range of about a couple of $\alpha$s, where $\alpha$ is the parameter describing the E-beam width and the range of forward scattering. $\alpha$ is usually in the range 0.05–0.15 $\mu$m. The internal area may then, if necessary, be further divided into intermediate sleeves and a smaller internal area. This process may be repeated any number of times, however it has been found that using only one intermediate sleeve provides very high accuracy and in most cases sufficient accuracy is obtained without intermediate sleeves at all.

Figure 2:
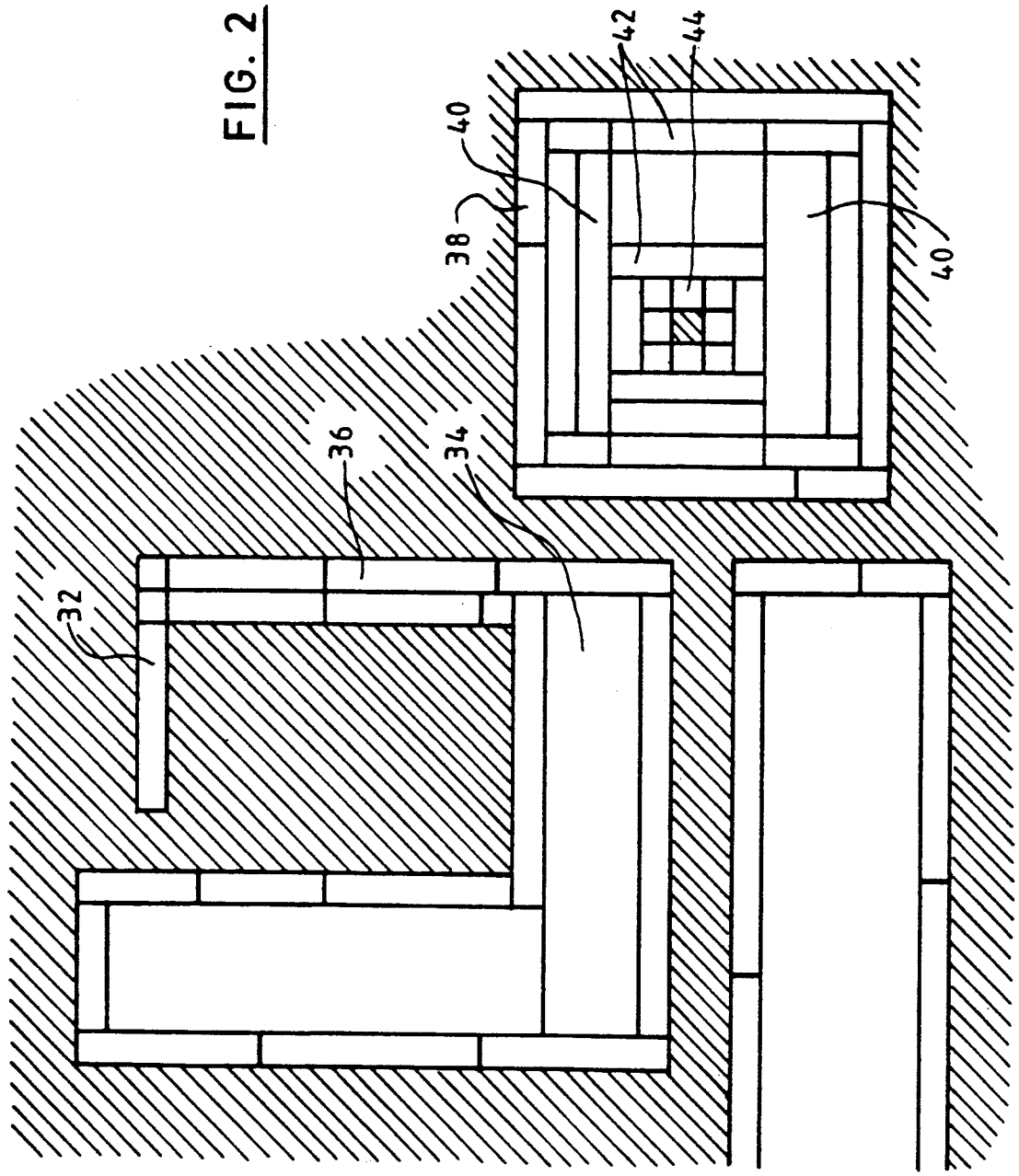
FIG. 2 is a diagram showing an illustrative partitioned design pattern.

This is illustrated in FIG. 2 which shows an example of a partitioned design pattern. Shape 32 has been divided into edge sleeves such as 36 and internal areas such as 34. Shape 38 has been divided into edge sleeves such as 44, intermediate sleeves such as 42 and internal areas such as 40. For purposes of illustration shapes in the same design have been shown in FIG. 2 with, 38, and without, 34, intermediate sleeves, although it should be noted that in practice intermediate sleeves would probably be used either for all shapes over a design or for none of the shapes on a design.

The electron backscatter varies along the length of each sleeve, but, to a good approximation, is constant across it. Hence the field variation within each sleeve may be described by a one dimensional representative indicator function F(x) which only varies along the length of the sleeve, the indicator across the sleeve being assumed to be constant.

Figure 3:
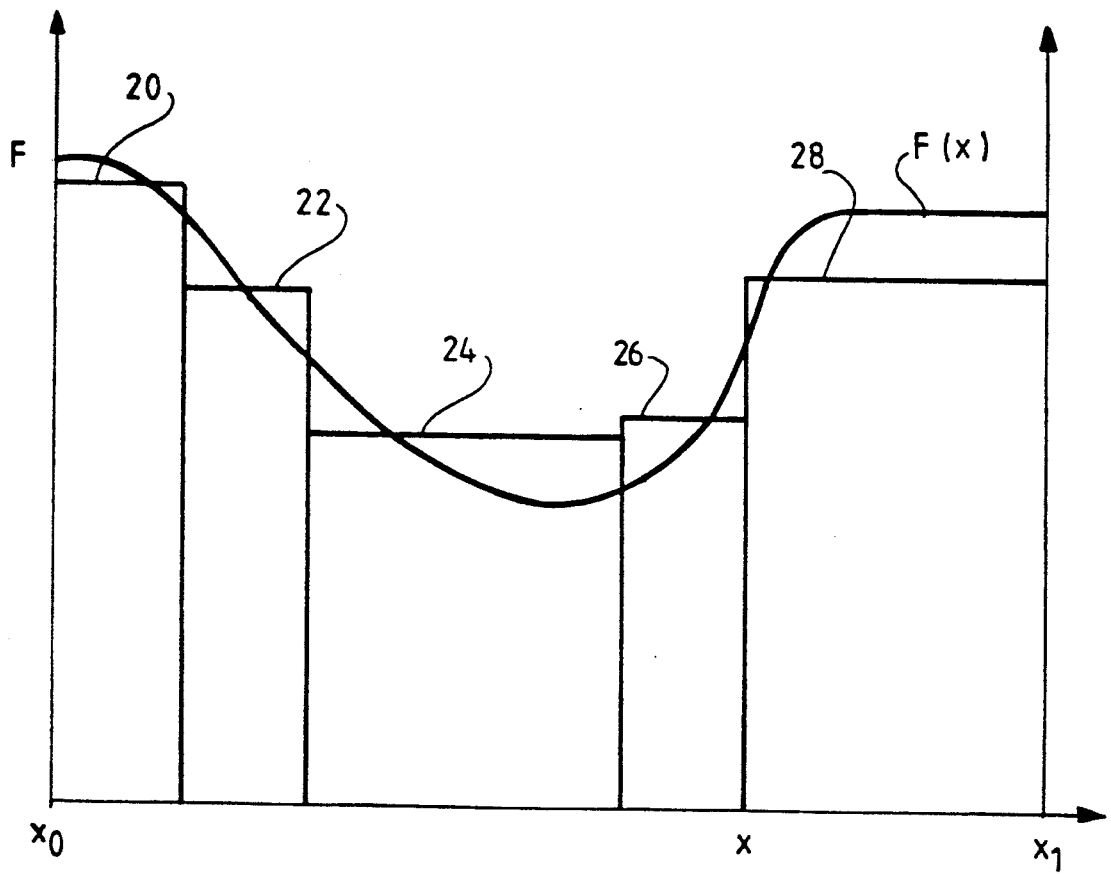
FIG. 3 shows a graph illustrating the representative indicator function and the piece-wise approximation to it.

Each sleeve is subdivided into a set of rectangles using an adaptive method to approximate the one-dimensional representative function F(x) as a series of line segments of constant backscatter. This is illustrated in FIG. 3. The function F(x) is approximated by the series of line segments 20, 22, 24, 26, 28, between $x=x_0$ and $x=x_1$.

The minimum number of rectangles needed to approximate the representative function depends on the required precision. Therefore, first of all, the precision, $\epsilon$, for the approximation has to be specified. In the different regions of the shape different criteria are used to determine the required precision. The accuracy criterion for the edge regions is the most stringent, therefore, these regions are generally partitioned into the largest number of rectangles. The intermediate regions (if there are any) are sub-partitioned into a much smaller number of rectangles. The inner area receives a constant dose, which corresponds to the average of the indicator field over this region.

Exposing the resist with the dose corresponding to representative indicator function, F(x), which varies only along the length of the sleeve, instead of the 2-D function either backscatter S(x,y) or dose D(x,y) obtained from the proximity correction module causes small errors in edge positioning of the developed shape. However the representative indicator function has to be approximated by the series of line segments of constant values corresponding to constant dose values in such a way that the resulting edge positioning error will be tolerable. Therefore it is necessary to express the error in the indicator value in terms of the edge positioning error. Given the maximal error $\delta x$ in the edge position, the tolerable error in the effective exposure E at $x=0$ can be written as $$\delta E = \frac{dE}{dx}\bigg|_{x=0} \delta x \quad (1)$$

The error in the exposure at $x=0$ may be calculated from the doses applied to a series of sleeves and their errors. For an example where the sleeve widths are 0.5 $\mu$m for the edge sleeve and 1.0 $\mu$m for the intermediate sleeve and where the assumed shape edge is at a distance 0.075 $\mu$m from the edge of the first sleeve and for proximity effect parameters of $\alpha=0.1$ $\mu$m, $\beta=2.75$ $\mu$m and $\mu=0.95$, if the nominal doses are, $D_i$ (for the edge sleeve)=2 and $D_2$ (for the intermediate sleeve)=1 and the maximum tolerable edge shift is $\delta x=0.01\alpha$ (1 nm) then the maximal tolerable errors in the doses may be calculated as $\alpha D_1=0.0134 D_1$ and $\delta D_2=0.0387$. Therefore, the dose in the first sleeve has to be approximated by a piece-wise constant function so that the relative error does not exceed 1.34%. The dose in the second sleeve has to be approximated so that the absolute error does not exceed 3.9% of the nominal dose. Since the dependence of the dose on the backscatter is predetermined the errors permissible for the dose are easily converted to those for the backscatter.

It has been found by calculations such as that described above that the error in the backscatter, which gives a tolerable error in the final developed edge position is about 1% to 2% for the first sleeve and that the tolerable error in the backscatter for the second sleeve is much larger i.e. about 2% to 4%. In the further sleeves or in the internal area the error can be of the order of tens of percent.

Within each sleeve the representative indicator function F(x) is approximated by a piece-wise constant function F'(x) so that $$|F(x)-F'(x)| \leq \epsilon \quad (2)$$

to give the minimum number of intervals in which F'(x) is constant.

In general, the required precision or error $\epsilon$ is given as a sum of an absolute error and a relative error: $\epsilon=\sigma_0+\sigma_1 F(x)$, where $\sigma_0$ is an absolute error and $\sigma_1$ is a relative error. The approximation error could be expressed through F' and not through F since these two values are approximately equal and therefore only a small additional error, of order $\epsilon^2$, is introduced.

The minimum number of subdivisions is achieved by choosing the intervals such that $|F(x)-F'(x)|=\epsilon$ at least at two points in each interval. The i-th interval and the approximate value $F'_i$ are found from the equation, $$M-m=2\epsilon, F_i=(M+m)/2, \quad (3)$$

where $M=\max(F(x))$ and $m=\min(F(x))$
i.e. the interval is chosen such that the variation of F(x) in it is equal to twice the tolerable error.

There will now be described an example of an algorithm which may be used to partition the sleeves in accordance with the invention.

In the embodiment the backscatter field is linearly interpolated between the points of the grid and the representative backscatter function S(x) along the sleeves is also linearly interpolated between its grid values.

The backscatter field S(x,y) is described by its values $S_{ij}$ on a coarse grid $x_i=i\delta, y_j=j\delta$, and intermediate values at a point $x=x_i+a\delta, y=y_i+b\delta$, where $0 \leq a, b \leq 1$, could be found by linear interpolation along the x and y axes:

$$S_{i+a,j+b} = S((i+a)\delta,(j+b)\delta) = \quad (4)$$
$$(1-a)(1-b)S_{i,j} + (1-a)bS_{i,j+1} + b(1-a)S_{i+1,j} + abS_{i+1,j+1}$$

Using this scheme the value of the backscatter field at any point intermediate to the grid points may be found as a linear combination of the four nearest grid points.

Along the sleeve under consideration the representative backscatter field is given, as a function of a coordinate x running along the sleeve, by, $$S(x-x_0) = s_0 + s_1(x-x_0), \quad (5)$$

where $x_0$ is the x coordinate of the grid cell boundary which can, without loss of generality, be set to 0. $s_0$ and $s_1$ may be found from the values of the backscatter at the points where the sleeve crosses the boundary of the grid cell. Note that, for each sleeve, one only needs to find $s_0$ and $s_1$ once for each grid cell, through which the sleeve passes. Since the field is described by a coarse grid, the sleeve within each grid cell can be partitioned into several subshapes, all of which use the same $s_0$ and $s_1$. No additional sampling of the backscatter field is needed inside this grid cell.

If there is a partition at $x=-a$ and there is to be another partition at x then the interval from $-a$ to x must satisfy the following requirement, $$M(x)-m(x)=2\epsilon(x), \text{ where } M(x)=\max S(\delta),$$
$$m(x)=\min S(\delta),$$

where $\delta$ is in the range $-a$ to x and $\epsilon(x) = \sigma_0 + S_0\sigma_1, S_0 = [m(x)+M(x)]/2$ being the constant value to be assigned to this interval.

Let us assume that the interval $(-a,0)$ has already been checked as a possible interval for partitioning and it was found that the representative function there varies in the range m to M:

$$m(0) \leq S(\delta) \leq M(0), \text{ for } -a \leq \delta \leq 0),$$

where however the difference $M(0)-m(0)$ is greater than or equal to twice the tolerable error: $M(0)-m(0) \geq 2\epsilon(0)$.

The interval $(-a,0)$ is quite general, the only limitation is that it is a part of the sleeve under consideration (that is points $x=-a$ and $x=0$ belong to that sleeve). The initial point $-a$ of this interval could be 0, in this case $m(0)=M(0)=S(0)$. The interval could be even greater than the cell size. Suppose that for some interval $(0,r)$ the backscatter function is represented as $S(x)=s_0+s_1 x$, where $s_0=S(0), s_1=S'(0)$, the prime denoting the derivative. We will try to enlarge the interval $(-a,0)$ by adding some interval $(0,x), x \geq 0$ on the right of the interval $(-a,0)$ so that the requirement of partitioning, equation 2, is still satisfied. The maximal possible interval $(-a,x)$ for which, equation 2 is satisfied is the interval for partitioning. There can be the following three cases:

1. $s_1 \geq 0$. In this case we try to find a point $x \geq r$, such that $$s_0+s_1 x = m(0)+2\epsilon = m(0)+2[\sigma_0+\sigma_1(m+\epsilon)],$$

or expressing $\epsilon=(\sigma_0+\sigma_1 m)/(1-\sigma_1)$:

$$s_0 + s_1 x = m(0) + 2\frac{\sigma_0 + \sigma_1 m(0)}{1-\sigma_1}$$

If the solution of this equation $$x = \frac{1}{s_1}\left[\frac{2\sigma_0}{1-\sigma_1} + \frac{1+\sigma_1}{1-\sigma_1} m(0) - s_0\right]$$

is smaller than r, then the partitioning interval is found. If $x>r$ then the linear interpolation $S(x)=s_0+s_1 x$ is no more valid for $x>r$. In this case one has to update M, to translate the origin to a point $x=r$, then to update the value of a and to try once more to enlarge the new interval.

2. $S_1 < 0$. In this case we try to find a point $x \leq r$, such that $$s_0+s_1 x = M(0)-2\epsilon = M(0)-2[\sigma_0+\sigma_1(M(0)-\epsilon)],$$

or expressing $\epsilon=(\sigma_0+\sigma_1 M(0))/(1+\sigma 1)$:

$$s_0 + s_1 x = M(0) - 2\frac{\sigma_0 + \sigma_1 M(0)}{1+\sigma_1}$$

If the solution of this equation $$x = \frac{1}{|s_1|}\left[\frac{2\sigma_0}{1+\sigma_1} - \frac{1-\sigma}{1+\sigma_1} M(0) + s_0\right]$$

is smaller than r, then the permitting interval is found. If $x>r$ then the linear interpolation $S(x)=s_0+s_1 x$ is no more valid for $x>r$. In this case one has to update m, to translate the origin to a point $x=r$, then to update the value of a and to try once more to enlarge the new interval.

3. $s_1=0$. In this case the interval $(0,r)$ is joined with the interval $(-a,0)$ and the procedure of interval enlargement repeated.

If the partitioning interval is finally found so that the boundary is at $x=x_{bound}$, the value $(m(x_{bound})+M(x_{bound}))/2$ is then assigned to that interval and the procedure is repeated from the beginning for the next interval unless the end of the sleeve has already been reached.

Each of the sleeves are partitioned in this way.

A more formal version of this algorithm using pseudocode follows. We first define the four procedures:

```
procedure initialize(x) ::=
    compute s₀ := S(x)
    set m = M := s₀
    set a := 0
    set fndflag := false
    return procedure update (x₀,x) ::=
    set a := a+x
    set x₀ := x₀+x
    set m := min {m,s₀ + s₁x}
    set M := max {M,s₀ + s₁x}
    return
```

-continued
```
procedure assign ::=
    call update (x₀,x)
    Assign the value S₀ := (m+M)/2 to the sleeve interval
    (x₀-a,x₀)
    set fndflag := true
    return
```

The basic procedure is named shot_continue, it carries out the procedure which has been described above:

```
procedure shot_continue::=
    compute s₀=S(x₀) and s₁=S'(x₀),
    so that the function S(x₀+x) is approximated as s₀+s₁x
    set r to the maximal x for which this approximation is valid
```

If $s_1 > 0$ then $$\text{set } x := \frac{1}{s_1}\left[\frac{2\sigma_0}{1-\sigma_1} + \frac{1+\sigma_1}{1-\sigma_1}m - s_0\right]$$

If $s_1 < 0$ then $$\text{set } x := \frac{1}{|s_1|}\left[\frac{2\sigma_0}{1+\sigma_1} - \frac{1-\sigma}{1+\sigma_1}M + s_0\right]$$

If $s_1 = 0$ then set $x := r$ return
The main program partitions the sleeves:
```
For each sleeve do
    choose the direction of x along the sleeve
    set x₀ to the sleeve beginning
    set endflag := false
    do while endflag = false
        call initialize(x₀)
        do while fndflag = false
            call shot_continue
            set x:= min {x,r}
            If x=0 then call assign
                else call update (x₀,x)
            If x₀ is the last point of the sleeve then
            do
                set endflag :- true
                call assign
            end
        end
    end
end.
```

The computation of the average of the indicator (e.g. backscatter) over an internal rectangle is made by interpolation formulas for the double integral of the indicator field. Then the integral of the indicator across a small rectangle is computed by sampling that double integral only at the four rectangle corners. Similarly, the computation of the indicator average across the sleeve width is made by interpolation formulas for the line integral of the indicator, computed by sampling the line integral at the sleeve edges.

As a further refinement to the technique it is possible to define the representative indicator function F(x) so that if the sleeve were to be exposed with the dose corresponding to the representative function then almost the same exposure would be experienced by the shape edge, so that no significant edge positioning error is induced by the substitution of the representative indicator function for the indicator as it was computed by the proximity correction module. This is because the indicator, the dose or the backscatter at the outer edge of the sleeve, nearest to the assumed shape edge influences the resulting effective exposure at the assumed shape edge more than the indicator, the dose or the backscatter at the inner edge. The effective exposure at the assumed shape edge can be expressed through the dose at the sleeve outer edge or through the dose average across the strip. In either case the expression contains a factor which depends generally on a distribution of the dose across the strip. Therefore a weighted average of the dose average and the dose edge value can be chosen as the representative value of the dose, so that the exposure at the assumed shape edge is unchanged by the use of the representative dose function D. For example with E beam parameters $\alpha=0.1$ μm, $\beta=2.75$ μm and $\mu=0.95$ and for the width of the first sleeve equal to 0.5 μm, the representative value of the backscatter value is equal to 0.65 times the edge value plus 0.35 times the average value. For the intermediate sleeve the representative value is taken to be the average value across the sleeve.

There has been described a method of partitioning design shapes, in an E-beam lithography system, into subshapes such that a constant dose may be applied to an E-beam sensitive resist within each subshape. Within each subshape the constant dose corresponds to an approximation to an indicator function, indicative of the degree of the proximity effect, such as the effective exposure of the resist from backscattered electrons or the required dose. The error of the approximation is equal to a predetermined value for each subshape, and depends upon the position of the subshape within the shape and the influence of errors in the applied dose at that position on the position, on development, of the edge of the shape.

We claim:

1. Method of partitioning, in an E-beam lithography system, a design pattern, comprising at least one design shape, into a plurality of subshapes to each of which a respective constant E-beam dose is applied, the method comprising the steps of:
    (a) determining, at a plurality of points on the design, an indicator field indicative of the magnitude of the proximity effect;
    (b) determining boundaries of the subshapes;
    (c) assigning a constant indicator value to each subshape;
    (d) assigning the respective constant E-beam dose to each subshape based on the value of the constant indicator value, and
   wherein the boundary determination and the constant indicator value assignment being such that, within each subshape, the constant indicator value represents an approximation to the indicator field, the error of the approximation being substantially equal to a predetermined value.

2. Method as claimed in claim 1 wherein the predetermined value for each subshape is chosen in dependence on the indicator field so as to provide, on development, a substantially constant error in the location of the edge of each design shape.

3. Method as claimed in claim 1 wherein the indicator field is the electron backscatter.

4. Method as claimed in claim 1 wherein the indicator field is the E-beam dose required to produce, on development, the required design pattern.

5. Method as claimed in claim 1 wherein the determination of the boundaries of the subshapes comprises the steps of:
    (b1) dividing the design shapes into rectangular sleeves and inner rectangular areas, each inner rectangular area being surrounded by rectangular sleeves;

(b2) determining a one-dimensional representative indicator function along the length of each of the sleeves, the one-dimensional indicator function being an approximation to the indicator field within the sleeve;

(b3) dividing the sleeves into the subshapes, along their length, so that the maximum deviation of the one-dimensional representative indicator function, within each subshape, is equal to twice the predetermined value, and wherein the constant indicator value for each subshape is assigned to be the mid-point of the range of the one-dimensional representative indicator function within the subshape.

6. Method as claimed in claim 5 further comprising the step between the steps (b2) and (b3) of determining the predetermined value from the one-dimensional indicator function so that, on development, the location of the shape edge lies within predetermined limits.

7. Method as claimed in claim 5 further comprising the additional step of dividing each said inner rectangular area into rectangular intermediate sleeves and an inner rectangular area and repeating steps (b2) and (b3) for the intermediate sleeves.

8. Method as claimed in claim 5 wherein the one-dimensional representative indicator function is chosen as a weighted sum of the indicator value at the edge of the sleeve and the average of the indicator field across the sleeve, the weights in the weighted sum being such that, on development, the error in the position of the edge of the shape introduced by the substitution of the indicator field by the one-dimensional indicator function is minimized.

* * * * *